United States Patent [19]

Alt

[11] Patent Number: 4,819,038

[45] Date of Patent: Apr. 4, 1989

[54] TFT ARRAY FOR LIQUID CRYSTAL DISPLAYS ALLOWING IN-PROCESS TESTING

[75] Inventor: Paul M. Alt, Yorktown Heights, N.Y.

[73] Assignee: IBM Corporation, Armonk, N.Y.

[21] Appl. No.: 945,935

[22] Filed: Dec. 22, 1986

[51] Int. Cl.[4] .................... H01L 27/12; H01L 27/14; H01L 29/04; H01L 29/78

[52] U.S. Cl. .......................... 357/4; 357/2; 357/30; 357/45; 357/32; 357/51; 357/23.7; 324/158 T

[58] Field of Search ....................... 357/30, 32, 45, 51, 357/2, 4, 23.7; 324/159 T

[56] References Cited

U.S. PATENT DOCUMENTS 3,930,304 1/1976 Keller et al. ........................ 357/51

FOREIGN PATENT DOCUMENTS

0163956 12/1985 European Pat. Off. .......... 357/30 K

*Primary Examiner*—Andrew J. James
*Assistant Examiner*—Jerome Jackson
*Attorney, Agent, or Firm*—Perman & Green

[57] ABSTRACT

An array of thin film transistor (TFT) devices is provided with a conductive region, such as a strip, for temporarily coupling a floating pel eletrode of each of the plurality of TFT devices to a conductor on an underlying substrate. The conductor may be a row or column metalization line associated with an adjacent row or column of the array. The conductive strip may therefore be utilized, in conjunction with appropriate voltage potentials and test circuitry, to test each of the TFT devices prior to the final fabrication of the TFT array into a completed flat panel display. Thus, non-functioning or out of specification arrays may be identified at an early point in the manufacturing cycle of the display. The strip may be comprised of amorphous silicon which is illuminated during the test in order to reduce the intrinsic resistance of the strip. The strip may also be comprised of a layer of metalization, which layer is removed from the array at the completion of the test.

8 Claims, 5 Drawing Sheets

TFT ARRAY FOR LIQUID CRYSTAL DISPLAYS ALLOWING IN-PROCESS TESTING

BACKGROUND OF THE INVENTION

This invention relates to thin film transistors (TFT) and, in particular, to an array of TFT devices, each of which is fabricated such that each may be electrically tested prior to the final assembly and packaging of the array into a liquid crystal display.

TFTs are three terminal electronic devices which, for display applications, are typically fabricated in large numbers upon an underlying insulating substrate as a regular two dimensional array organized as rows and columns. Two of the three terminals of each TFT are each typically connected to a respective row and column metalization line which are also disposed on the substrate. The third terminal, or pel electrode, is an electrically "floating" terminal relative to the first and second terminals. In order to complete an electrical circuit of the TFT through the floating pel electrode, subsequent processing steps are required. These processing steps, particularly in the fabrication of a flat panel display type of device, involve coplanarly mounting at some distance away from the array a glass panel having a transparent conductive coating. Such a glass panel comprises, in the simplest case, a counter electrode uniformly disposed over a surface serving as the common counter electrode for the underlying TFT pel electrodes. The space between the underlying substrate and the overlying plate is filled with a suitable liquid crystalline material. Circuit continuity is thereby provided through the intervening liquid crystal (LC) material from the pel electrode to the counter electrode, such that when the TFT device is suitably energized, the intervening liquid crystal material is activated, thereby forming a single pixel of the flat panel display.

In modern flat panel displays such an array of TFT structures may comprise from ten thousand up to a million devices. For example, to construct a medium resolution color display one million TFT devices may be required. As can be appreciated, the testing of such a structure presents a formidable manufacturing problem. This problem is compounded by the fact that a TFT device is not operable and, hence, cannot be tested until the flat panel display is completely fabricated. That is, both the overlying transparent plate having the counter electrode and the intervening liquid crystal material must be in place. As may be further appreciated, any defects in the array of TFT devices will therefore not be detected until after the final assembly of the display. Thus, for those arrays of devices that are defective for one reason or the other, such as having open, shorted, or functioning but out of electrical specification devices, the added expense of this final fabrication procedure must be incurred in order to determine the nonfunctionality of these devices.

Although it is conceivable that a mechanical type of probe may be employed to individually test the TFT devices by contacting the pel electrode of each device, this approach is not economically feasible. Any such mechanical probe need be of a very fine geometry in order to probe the relatively small pel electrode structures. The use of such a mechanical probe also implies that either the probe or the substrate be linearly translated in a precise manner during the testing operation, resulting in an overall test time for a large array which would prove to be economically unjustifiable.

SUMMARY OF THE INVENTION

The aforementioned problems are overcome and other advantages are realized by an array of TFT devices fabricated, in accordance with the invention, such that each of the TFT devices is provided with a conductive region, such as a strip, which connects each of the pel electrodes to a conductor already present on the substrate. This conductive strip may therefore be utilized, in conjunction with suitable test circuitry, to individually test each of the TFT devices prior to the final fabrication of the TFT array into a completed flat panel display. Thus, nonfunctioning or out of specification arrays may be identified at an early point in the manufacturing cycle, without incurring the subsequent expense of completing the assembly of the display in order to test the TFT devices.

In a preferred embodiment of the invention, each of the pel electrodes is provided with a strip of conductive amorphous silicon which connects each pel electrode to an adjacent row or column metalization line. Such a strip of amorphous silicon has the intrinsic property of being photoconductive. Thus, by exposing the strips individually or collectively to a source of illumination the associated pel electrodes are conductively coupled to one of the adjacent metalization lines. This allows the electrical properties of the TFT device to be characterized by applying suitable voltage potentials to row and column metalization lines and thereafter measuring the resulting current flow through the TFT device. Such a TFT device test is therefore performed at a point in the manufacturing cycle before the expense of fabricating a completed display is incurred.

In another embodiment of the invention, the conductive strip is comprised of a line of metalization, which line of metalization is subsequently removed from the array of devices after testing by opening the line with a source of laser radiation, or by a batch etching process.

A flat panel display constructed in accordance with the invention may also be advantageously employed to input information into a system having the display, the information being provided by way of a light pen or some other optical source. Current sensing means coupled to the display output a signal corresponding to a portion or portions of the display being illuminated thereby enabling the system to determine the location of the illuminated portion.

BRIEF DESCRIPTION OF THE DRAWINGS

The aforementioned aspects and other features of the invention are explained in the following description, taken in connection with the accompanying drawings wherein.

DETAILED DESCRIPTION OF THE INVENTION

Figure 1:
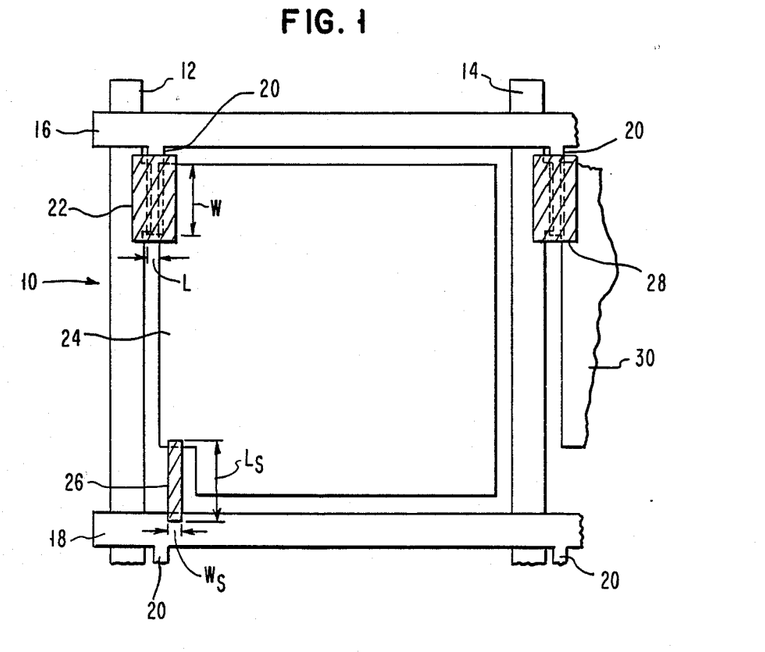
FIG. 1 is top view, partially stylized, of a single TFT device embodying the invention.

With reference to FIG. 1, there is shown a thin film transistor (TFT) 10. TFT 10 is formed near an intersection of two metalization lines, or buses, which are disposed in a regular grid-like fashion upon the surface of an insulating substrate (not shown), the lines being electrically insulated one from another in a conventional manner. These metalization lines are column lines 12 and 14 and row lines 16 and 18. As may be seen, the column and row metalization lines are disposed in a regular grid, with the TFT 10 being disposed within a region defined by pairs of intersecting column and row metalization lines. Each of the row metalization lines, such as line 16, is fabricated such that it has a plurality of depending spurs, each such spur defining a region which forms a gate electrode 20. Disposed above and conductively coupled to the gate electrode 20 and a portion of the column metalization line 12 is an active area 22 which is comprised of semiconductor material such as amorphous silicon. This active area is deposited by conventional thin film deposition techniques, such as by vapor phase deposition, sputtering, plasma enhanced chemical vapor phase deposition, or by any similar well known process. Active area 22 may also be seen to overlie a portion of a pel electrode 24, the pel electrode 24 also being formed as a thin film conductive layer upon the substrate. Each pel electrode may be from 10 to 20 mils on a side, although the actual dimension is not critical to the operation of the invention.

Inasmuch as a TFT is a field effect transistor type of device, the point of contact between the active area 22 and the column line 12 may be considered to be the source electrode of the device. The gate electrode is the aforementioned electrode 20 and the drain electrode is the pel electrode 24. Associated with each active area 22 is a characteristic length (L) and width (W).

Although one TFT 10 is shown in FIG. 1, it should be realized that a typical TFT array may be comprised of a large number of such devices, such as ten thousand or even a million of such devices disposed in a two dimensional array having many hundreds of row and column lines. Access to a particular one of the TFT 10 devices within the array is gained by energizing a specific combination of column and row metalization lines such that the TFT 10 device which lies at the intersection of the energized lines, such as for example the metalization lines 12 and 16, will be energized. A portion of an adjacent TFT device can be seen to have an active area 28 and a pel electrode 30. Such a TFT device as shown in FIG. 1, however, is not electrically operable due to the fact that the pel electrode 24 is essentially a "floating" electrode, or terminal, of the device. In order to achieve circuit continuity to the pel electrode a typical flat panel display device which includes such an array will have an overlying transparent plate, such as a glass plate, (not shown) disposed in a spaced apart manner from the underlying TFT array. The surface of the plate facing the TFTs will have a transparent conductive coating, such as indium tin oxide, deposited thereon to form a counter electrode. The region between the TFT array and the counter electrode is filled with a suitable material, typically a liquid crystal material. Other materials may also be used to provide the optical contrast needed for a display. One such material may be an el ectrophoretic material. Also, an electroluminescent material can be used with a modification to the manner in which the counter electrode is provided, as is well known. Circuit continuity to the pel electrode is established through the intervening liquid crystal material to the counter electrode disposed upon the overlying surface of the transparent panel. When suitably energized, the resulting field due to the current flow from the pel electrode through the liquid crystal material into the counter electrode results in a rearrangement of the liquid crystal molecules, thereby providing a visible optical effect, such as a change in optical contrast. Thus, there is created a visible region, or pixel, upon the flat panel display.

As has been previously discussed, a TFT device of the prior art cannot be electrically tested until assembled into such a flat panel display device. Thus, in accordance with the invention, the TFT 10 is provided with a conductive strip 26 which connects the pel electrode 24 to an adjacent metalization line, such as the row line 18.

Strip 26 may be comprised of an area of metalization deposited in strip form such that it contacts both the pel electrode 24 metalization and the adjacent row 18 metalization. In a preferred embodiment of the invention, strip 26 is comprised of amorphous silicon, which material is the preferred material for fabrication of the active area 22 of TFT device 10.

If the strip 26 is comprised of amorphous silicon it is possible to vary the conductivity of the strip 26 by varying the intensity of a source of illumination incident upon the strip 26, due to the fact that amorphous silicon has the property of being an efficient photoconductor. Typically, the conductivity of amorphous silicon may be varied over a range of six orders of magnitude from a dark, high resistance state to a fully illuminated, highly conductive state. Thus, it can be seen that the strip 26 during the normal, that is low illumination, operation of a display panel embodying the invention will have a characteristically high resistance. This inherently high resistance in effect insures that the strip 26 will have a negligible affect on the operation of the TFT 10.

Figure 2:
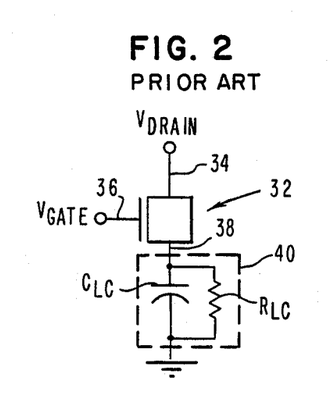
FIG. 2 is a schematic diagram showing the equivalent impedances of a TFT/LC device of the prior art.

Referring to FIG. 2 it can be seen that a typical TFT 32 of the prior art is comprised of a source electrode 34, a gate electrode 36, and a drain electrode 38. The drain electrode 38 is similar to the pel electrode 24 of FIG. 1. When utilized within a flat panel display the drain electrode 38 may be seen to have a load associated with it due to the intervening liquid crystal material and the counter electrode. This load may be characterized as having a characteristic impedance comprised of a capacitive element $C_{LC}$ and a resistive component $R_{LC}$, the subscript referring to the liquid crystal (LC) material.

Figure 3:
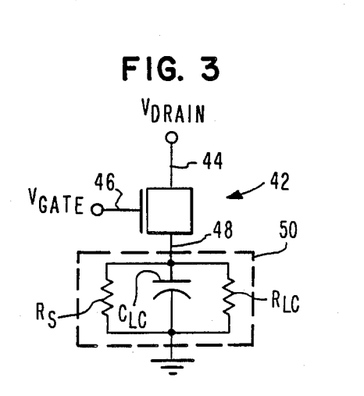
FIG. 3 is a schematic diagram showing the equivalent impedances of a TFT/LC device having one embodiment of the invention wherein the gate lines of adjacent rows are assumed to be tied to the same potential as the counter electrode.

As seen in FIG. 3 a TFT 42, in accordance with the invention, also has a source electrode 44, a gate electrode 46, and a drain electrode 48. The characteristic impedance 50 experienced by the drain, or pel electrode, 48 may be characterized as having three components. In addition to the aforementioned capacitive and resistive impedances associated with the liquid crystal material, $C_{LC}$ and $R_{LC}$, respectively, there is a resistive component $R_S$ associated with the amorphous silicon strip 26.

Due to the fact that $R_S$ is in parallel with $R_{LC}$ it can be seen that if the resistance associated with $R_S$ is much greater than the resistance associated with the liquid crystal material $R_{LC}$, then the effective resistance experienced by the pel electrode will be essentially that of $R_{LC}$. Only during the testing of the array, due to high illumination of the strip 26, is the resistance of the strip a factor. During testing of the array, in accordance with the invention, the components $C_{LC}$ and $R_{LC}$ are not present due to the fact that there is no liquid crystal material adjacent to the pel electrode. Thus, the pel electrode 24 experiences only the resistance $R_S$ associated with the strip 26.

Referring once more to FIG. 1 it can be seen that the strip 26 has a length $L_S$ and a width $W_S$. A typical width of strip 26 may be one half of a mil. As is well known, the resistance of such a strip of amorphous silicon is proportional to a ratio of the length to the width of the strip. Thus, by determining a proper geometry of the strip 26, the ratio of the resistance $R_S$ ($L_S/W_S > 1$) of the strip to the off resistance of the TFT ($L/W < 1$) may be adjusted such that a ratio of ten, one hundred, or even more may be obtained. Thus, it can be assured that the presence of $R_S$ has a minimal effect during normal device operation, which operation may include illumination from a backlight.

In addition, unless special processing is performed the contacts to the amorphous silicon strip 26 will not be ohmic. During normal display operation the pel electrode 24 voltage is small and the barrier contacts to the strip 26 will add to the strip impedance $R_S$. At high test voltages, however, the barrier contacts will break down and this, together with high illumination, will significantly lower the strip impedance.

During the testing of TFT 10, the source of illumination may be varied to vary the conductivity of the strip 26 to simulate a typical liquid crystal load. Likewise, at high illumination intensities the value of $R_S$ may be made much smaller than the characteristic liquid crystal load thereby enabling the TFT characteristics themselves to be readily measured.

Figure 4:
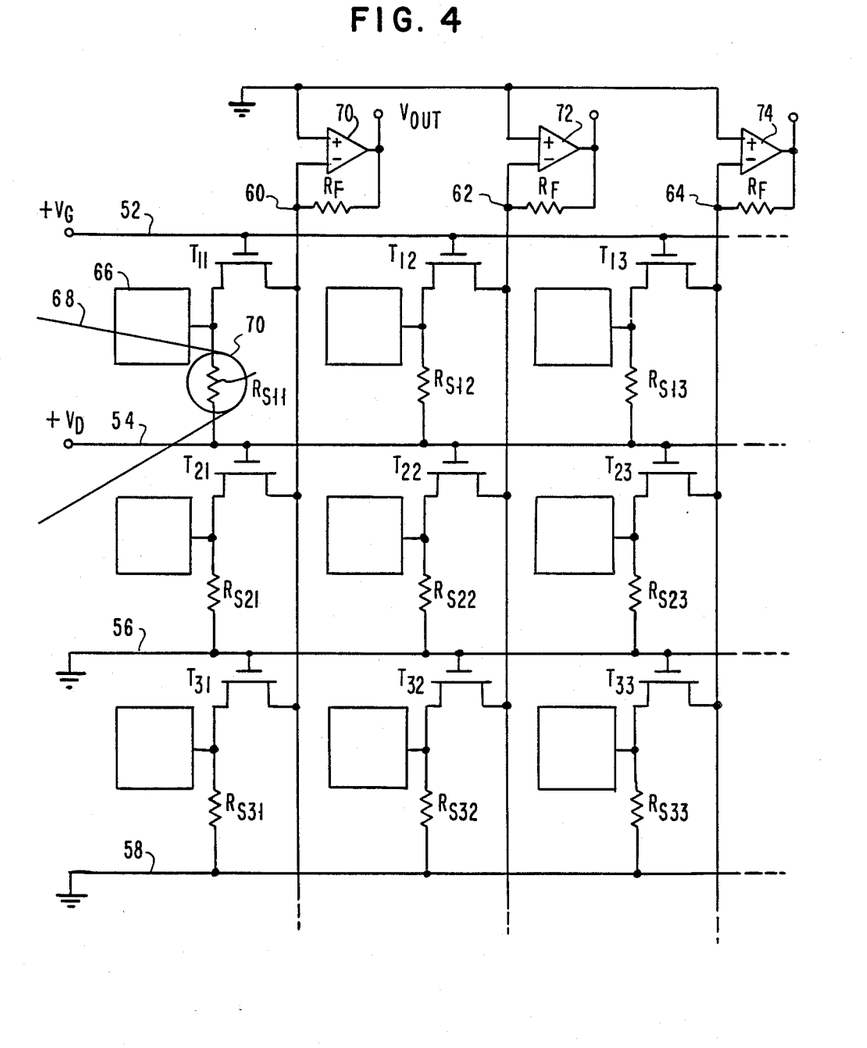
FIG. 4 is a schematic diagram of a portion of a TFT array having an embodiment of the invention and testing circuitry therefore.

Referring now to FIG. 4, a method and apparatus for testing a plurality of TFT devices will now be described. As can be seen, a portion of an array of TFT devices is shown, it being understood that the array may be comprised of a much larger number of TFT devices than the nine devices depicted in FIG. 4. A plurality of row metalization lines 52–58 and a plurality of column metalization lines 60–64 are provided for connecting to the gate and source electrodes, respectively, of the plurality of TFT devices. In accordance with the invention, each of the TFT devices has an associated resistance connecting the pel electrode of each to an adjacent row line. For example, TFT device $T_{11}$ may be seen to have a pel electrode 66 which is connected via a resistor $R_{S11}$ to adjacent row lines 54, which row line 54 is used during the normal operation of the display to access the TFT devices $T_{21}$, $T_{22}$, $T_{23}$, etc. This resistance $R_{S11}$ is representative of the characteristic resistance of the strip 26 of FIG. 1.

In order to test $T_{11}$ the amorphous silicon material which comprises the strip 26 is illuminated. As can be seen, a beam 68 of radiation is focused to a spot 70 upon the strip 26. A suitable source of focused radiation may be a laser (not shown) or some other source of radiation which may be focused to a spot having a sufficient intensity to cause the strip 26 to become conductive. In practice, the focused beam would be rapidly scanned in raster fashion over the entire array, thereby testing in sequence each TFT.

In order to energize TFT device $T_{11}$ a positive gate potential $V_G$ is applied to the associated row line 52 and a source of positive drain potential $V_D$ is applied to the adjacent row line 54 associated with $T_{21}$.

During the testing of such a TFT device a typical range of values for $V_G$ may be from zero to 20 volts and a typical range of values for $V_D$ may be from zero to 20 volts. Due to the potentials $V_G$ and $V_D$ current is caused to flow through the resistance $R_{S11}$ and through the TFT device $T_{11}$. A current sensing means is provided at the output of column line 60 in order to provide a complete circuit path for the current $i_s$. Such a current sensing means, such as an operational amplifier 70 having a feedback resistance $R_F$, operates as a current to voltage converter and develops a voltage output $V_{out}$ which is proportional to the magnitude of the current $i_s$ while maintaining the potential of line 60 at a ground potential.

In the testing embodiment shown in FIG. 4 one TFT device is tested at a time due to the radiation being focused to a spot which illuminates a single strip 26.

In operation, the focused beam of radiation 68 is moved from TFT device to TFT device to test each in sequence. As can be seen all of the TFT devices within a row may be tested in this manner by shifting the beam of radiation 68 in a direction from left to right in the drawing of FIG. 4. When it is desired to test the adjacent row of TFT devices the voltage $V_G$ would be applied to row line 54 and the voltage $v_D$ would be applied to row line 56 in order to test this row of devices. As may be seen, a row line associated with a row of TFT devices which is not being tested is grounded to prevent current from other TFT devices from possibly interfering with the measurement of the selected TFT.

Figure 5:
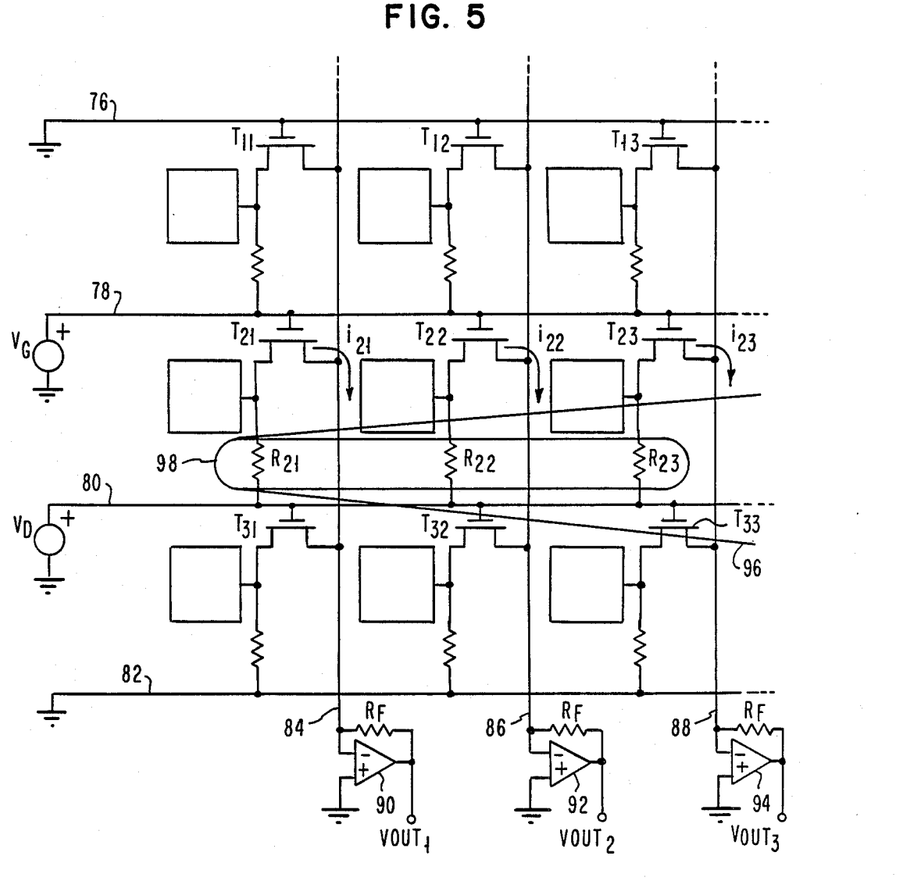
FIG. 5 is a schematic diagram showing an alternate method of testing a TFT array having an embodiment of the invention.

Referring now to FIG. 5 there is shown an alternate method, in accordance with the invention, of testing an array of TFT devices. As can be seen, a plurality of row lines 76 thru 82 and column lines 84 thru 88 are provided for connecting to a plurality of TFT devices labeled $T_{11}$, $T_{12}$, $T_{13}$, etc. In addition a plurality of operational amplifiers 90, 92 and 94 are provided each having one input terminal connected to a respective column line. A beam of incident radiation 96 is shown to be focused in the shape of a bar 98. Bar 98 illuminates a plurality of the amorphous silicon strips 26, shown in FIG. 5 by their characteristic resistances $R_{21}$, $R_{22}$ and $R_{23}$. In order to energize the TFT devices $V_G$ and $V_D$ are applied to the associated and adjacent row lines, respectively, in order to generate a flow of current through each of the TFT devices within the row. Thus, it may be seen that a plurality of TFT devices within a row may thereby be simultaneously energized and tested. The resulting currents, shown as $i_{21}$, $i_{22}$ and $i_{23}$, flow into the virtual ground presented by a noninverting terminal of each of a respective one of the operational amplifiers 90 thru 94. Amplifiers 90 thru 94 are provided, as in FIG. 4, with a feedback resistance $R_F$ in a well known inverting amplifier configuration. Each of the operational amplifiers will thereby have a voltage output shown as, for example, $V_{out1}$. Each of these resulting output voltages may be individually measured by suitable measuring equipment (not shown) or a plurality of such voltage outputs may be coupled to a suitable multiplexing device such that each voltage may be applied in sequence to a common voltage measuring device.

Each of the TFT measuring methods and apparatus as shown in FIGS. 4 and 5 may be utilized to characterize a number of electrical parameters associated with the TFT devices within an array. The parameters which may be desired to be characterized may be the on-resistance of the device, the off-resistance of the device, and a number of other well known parameters. For example, the threshold voltage of a TFT device may be determined by maintaining $V_D$ and the illumination intensity at a fixed level while varying the magnitude of $V_G$ while simultaneously measuring the output voltage of the respective operational amplifier.

Figure 6:
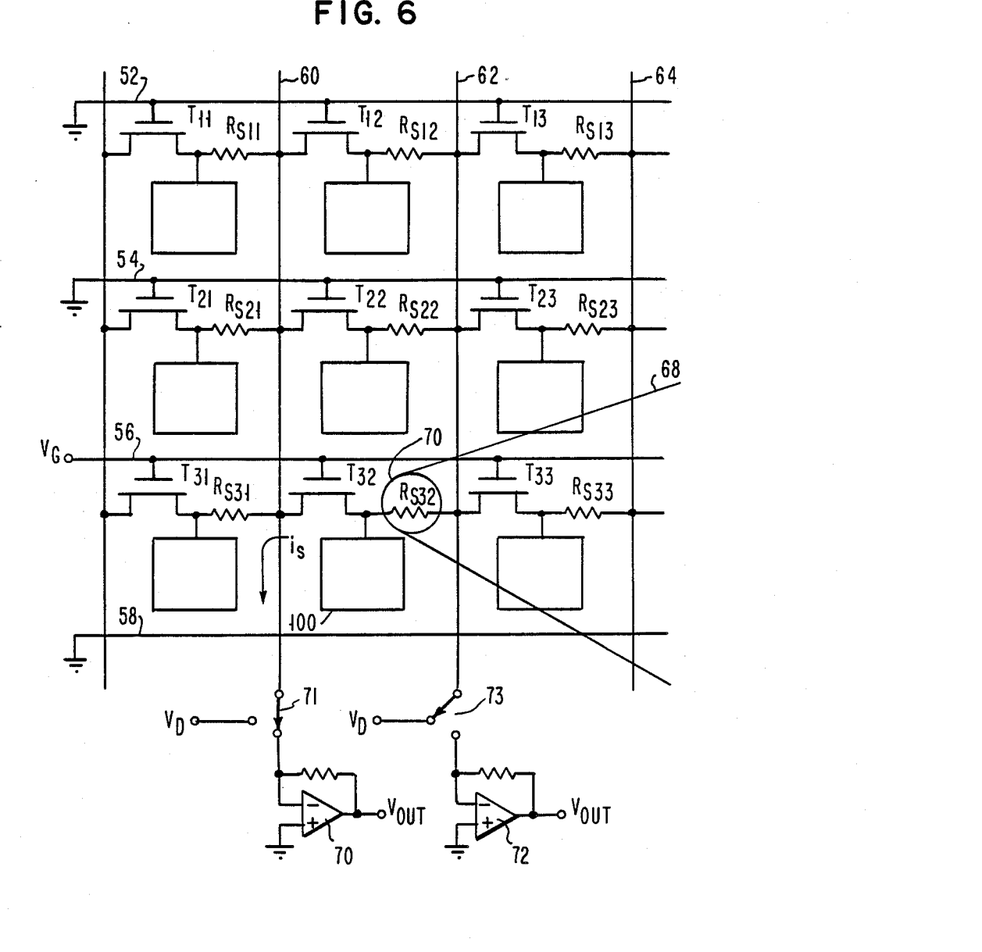
FIG. 6 is another schematic diagram of a TFT array fabricated in accordance with another embodiment of the invention.

In another embodiment of the invention, shown in FIG. 6, the conductive strip 26 having an associated resistance $R_{S32}$ forms an electrical connection between a pel electrode 100 and an adjacent column line 62. In this case the three terminals of the TFT device under test, namely $T_{32}$, are accessed through the associated row line 56, the associated column line 60 and the adjacent column line 62. Depending upon the details of the process used to fabricate the TFT device and the geometry of the interconnecting metalization lines this configuration may be simpler to fabricate. A testing sequence for this type of arrangement would be limited to testing one TFT device at a time due to the fact that multiple devices under test cannot each contribute a current to a common column line. This may not, however, be a significant limitation in that all of the rows and columns may be simultaneously contacted. Voltages $V_G$ and $V_D$ may then be rapidly switched from one TFT device to another, via electronic means such as switches 71 and 73, much as is done in the typical row-at-a-time scanning of the display panel during the normal operation of such a panel. Similarly, the focused illumination 70 may be rapidly scanned across the array.

Instead of being comprised of amorphous silicon the conductive strip 26 may be comprised of a thin film of a metal, such as aluminum. During the testing phase such a metallic strip would provide the pel electrode contact material. Other conductive materials are also possible. After testing, the metallic strip would be required to be removed from the TFT device by, possibly, laser burnout deletion or by some other process. A batch process which involved etching away the metallic strips 26 may also be employed to facilitate the simultaneous removal of the strips. It can be appreciated, however, that if the material utilized for the conductive strip 26 is amorphous silicon that no additional materials or processing would be required during the fabrication of the array. Each conductive strip 26 would be deposited upon the substrate at the same time that the TFT devices are deposited since each would be comprised of the same amorphous silicon material. Also, amorphous silicon strips do not require physical removal after testing. Inasmuch as they are coupled in parallel with the normal pel electrode load, their intrinsically high resistance when not illuminated would effectively remove them from the circuit.

The use of amorphous silicon strips results in other utilities for the method and apparatus of the invention, beyond those disclosed above relating to the testing of an array of the TFT devices.

In particular, applications involving the optical writing of information into a TFT/LC display are possible. One such application involves the use of a light pen in this case a light-emitting pen, to draw lines on the display or to point to items on the screen. Another example is the use of an external light and a transparency to create an image on the display. In these applications the display would be equipped with current sensing circuitry, such as in FIG. 5 for example. The array would be scanned electronically row by row and a sensed current would correspond to those TFTs (pixel elements) that had been illuminated. The sensed data would be written line by line into a display frame buffer associated with the display in order to form an image corresponding to the illuminated portion of the screen.

Figure 7:
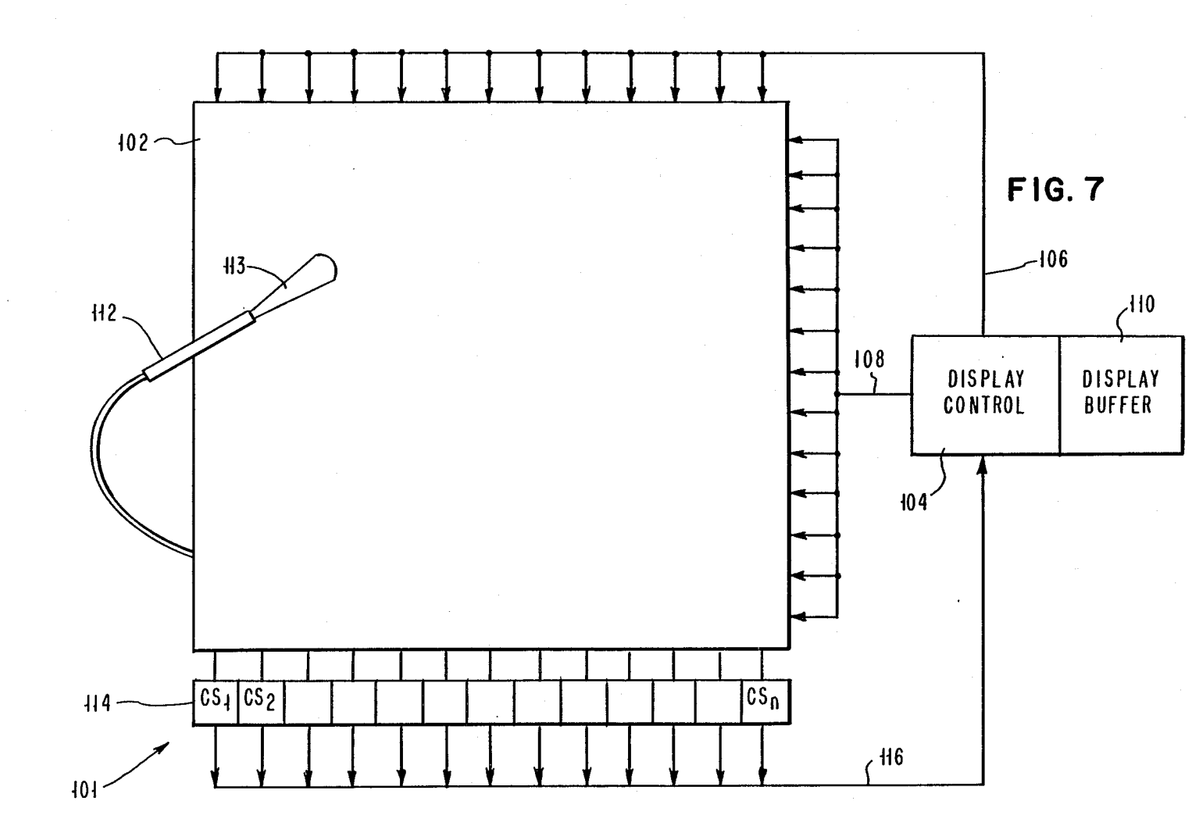
FIG. 7 is a block diagram of a display system having a TFT array, constructed in accordance with the invention, which permits information to be entered into the system in an optical manner.

Referring now to FIG. 7 one such optical writing system 101 is shown to be comprised of a display panel 102 having a TFT/LC array constructed, in accordance with the invention, with amorphous silicon strips connecting each pel electrode to an adjacent metalization line.

A display controller 104 has a plurality of column outputs 106 and a plurality of row outputs 108 for sequentially energizing specific pixels (not shown) of the panel 102 in accordance with the contents of a display buffer 110. Buffer 110 is typically a memory device which stores data expressive of the image, such as textual and/or graphical images, displayed upon the panel 102. Controller 104 may be a dedicated controller or may be embedded within a data processing system, such as a word processing or some other type of system.

In accordance with this embodiment of the invention a light source means, such as a light emitting pen 112, is provided for illuminating desired portions of the panel 102 with a light output 113. Also coupled to panel 102 are a plurality of current sense means 114, shown as $CS_1$, $CS_2$ to $CS_n$. Each of the current sense means 114 may be an operational amplifier having a suitable feedback resistor $R_F$ and an input terminal coupled to a column line of the panel, much as is shown in FIG. 5. The output of each current sense means 114 is coupled by output lines 116 to the display controller 104. During normal operation of the panel 102 controller 104 activates a particular one of the row lines 108 and subsequently activates the column lines 106 in order to interrogate one row of the display. This procedure is repeated for each row until the entire display has been interrogated, at which time the process is repeated. If, during the activation of a particular row and column, a signal is received from the corresponding current sense means 114, the controller 104 determines which portion of the display is being illuminated by pen 112.

Thus, it can be appreciated that it is possible to directly input information to the display controller 104 by illuminating a desired pixel or pixels, thereby reducing the normally high resistance of the strips associated with the underlying TFT devices to cause a current flow through these devices. This information may be utilized to cause controller 104 to perform some action, such as to select a specific item from a displayed menu of items. This information may also be stored within buffer 110 by controller 104 for subsequent display upon the panel 102.

It is to be understood that the above described embodiments of the invention are illustrative only and that modifications thereof may occur to those skilled in the art. Accordingly, this invention is not to be regarded as limited to the embodiments disclosed herein, but is to be limited only as defined by the appended claims.

Having thus described my invention, what I claim as new, and desire to secure by letters patent is:

1. An array of thin film transistor devices comprising:
    an insulating substrate;
    a first plurality of spaced apart conductors disposed substantially parallel one to another upon said substrate;
    a second plurality of spaced apart conductors disposed upon said substrate substantially parallel one to another and perpendicularly to said first plurality of conductors to form a grid pattern upon said substrate, each of said second plurality of conductors having a plurality of stub-like extensions depending substantially perpendicularly therefrom, individual ones of said extensions being adjacent and substantially parallel to an individual one of said first plurality of conductors;
    a plurality of electrode each of which is disposed upon said substrate, individual ones of said electrodes being disposed between intersecting pairs of said first and second conductors;
    a plurality of semiconductor layer regions disposed such that individual ones of said layer regions overlie one of said extensions and at least a portion of a corresponding adjacent one of said first plurality of conductors and a portion of a corresponding one of said electrodes, each of said layer regions being conductively coupled to an underlying one of the extensions, said corresponding one of said first conductors, and said corresponding one of said electrodes to form thereby a thin film transistor device having three terminals; and
    a plurality of conductive strips disposed such that individual ones of the strips couple one of said electrodes to one of the adjacent first or second plurality of conductors which is not coupled to the corresponding layer region.

2. An array of thin film transistor device comprising:
    an insulating substrate;
    a first plurality of spaced apart conductors disposed substantially parallel one to another upon said substrate;
    a second plurality of spaced apart conductors disposed upon said substrate substantially parallel one to another and perpendicularly to said first plurality of conductors to form a grid pattern upon said substrate, each of said second plurality of conductors having a plurality of stub-like extensions depending substantially perpendicularly therefrom, individual ones of said extensions being adjacent and substantially parallel to an individual one of said first plurality of conductors;
    a plurality of pel electrodes each of which comprises a conductive region disposed upon said substrate, individual ones of said regions being disposed between intersecting pairs of said first and second conductors;
    a plurality of semiconductor layer regions disposed such that individual ones of said layer regions overlie one of said extension and at least a portion of a corresponding adjacent one of said first plurality of conductors and a portion of a corresponding one of said conductive regions, each of said layer regions being conductively coupled to an underlying one of the extension, said corresponding one of said first conductors, and said corresponding one of said conductive regions to form thereby a thin film transistor device having three terminals; and
    a plurality of conductive strips disposed such that individual ones of the strips couple of said conductive regions to one of the adjacent conductors which is not coupled to the corresponding layer region, wherein said plurality of conductive strips are each comprised of a layer of amorphous silicon.

3. An array according to claim 1 wherein said plurality of conductive strips are each comprised of a layer of metalization.

4. An array of display driver transistor devices comprising:
    a substrate having a plurality of row metalization conductors and a plurality of column metalization conductors disposed in a grid-like fashion upon a surface of the substrate, the substrate further having disposed on the surface thereof a plurality of electrodes individual ones of which are disposed between adjacent pairs of the row and the column metalization conductors;
    a plurality of three terminal transistor devices individual ones of which having an active portion disposed at an intersection of a row metalization conductor and a column metalization conductor, a first terminal of each of the devices being electrically coupled to a row metalization conductor, a second terminal of each of the devices being electrically coupled to a column metalization conductor which intersects the row metalization conductor, a third terminal of each of the devices being electrically coupled to an adjacent one of the plurality of electrodes; and
    a plurality of regions each of which is capable of electrical conduction, each of the regions being coupled between one of the electrodes and an adjacent row or column metalization conductor, the adjacent row or column metalization conductor being a conductor which is not electrically coupled to a transistor device having a third terminal coupled to the electrode.

5. An array of display driver transistor device comprising:
    a substrate having a plurality of row metalization conductors and a plurality of column metalization conductors disposed in a grid-like fashion upon a surface of the substrate, the substrate further having disposed on the surface thereof a plurality of pel electrodes individual ones of which are disposed between adjacent pairs of the row and the column metalization conductors;
    a plurality of three terminal transistor devices individual ones of which having an active portion disposed at an intersection of a row metalization conductor and a column metalization conductor a first terminal of each of the devices being electrically coupled to a row metalization conductor, a second terminal of each of the devices being electrically coupled to a column metalization conductor which intersects the row metalization conductor, a third terminal of each of the devices being electrically coupled to an adjacent one of the plurality of pel electrodes; and
    a plurality of region each of which is capable of electrical conduction, each of the regions being coupled between one of the pel electrodes and an adjacent metalization conductor, the adjacent metalization conductor being a conductor which is not electrically coupled to a transistor device having a third terminal coupled to the pel electrode, and wherein each of the plurality of regions is comprised of amorphous silicon.

6. An array of display driver transistor device comprising:
- a substrate having a plurality of row metalization conductors and a plurality of column metalization conductors disposed in a grid-like fashion upon a surface of the substrate, the substrate further having a disposed on the surface thereof a plurality of pel electrodes individual ones of which are disposed between adjacent pairs of the row and the column metalization conductors;
- a plurality of three terminal transistor devices individual ones of which having an active portion disposed at an intersection of a row metalization conductor and a column metalization conductor, a first terminal of each of the devices being electrically coupled to a row metalization conductor, a second terminal of each of the devices being electrically coupled to a column metalization conductor which intersects the row metalization conductor, a third terminal of each of the devices being electrically coupled to an adjacent one of the plurality of pel electrodes; and
- a plurality of regions each of which is capable of electrical conduction, each of the regions being coupled between one of the pel electrodes and an adjacent metalization conductor, the adjacent metalization conductor being a conductor which is not electrically coupled to a transistor device having a third terminal coupled to the pel electrode, wherein each of the plurality of regions is comprised of amorphous silicon;
- wherein the array is a component of a display device and wherein each of the plurality of pel electrodes is electrically coupled to a common electrode through an intervening volume of material operable for generating a visible optical effect when subjected to an electrical field.

7. An array of thin film transistor devices as defined in claim 6 wherein each of the intervening volumes of material has a first characteristic electrical resistance associated therewith and wherein each of the plurality of regions has a second characteristic electrical resistance associated therewith, the second characteristic resistance of a particular region having a value which is a function of an amount of illumination applied to the particular region, the second characteristic resistance of each of the plurality of region during a typical operating illumination condition of the display device being at least approximately an order of magnitude greater than the first characteristic resistance of an associated volume of material.

8. An array of thin film transistor devices as defined in claim 7 wherein said intervening material is comprised of liquid crystal material, electrophoretic material, or electroluminescent material or combinations thereof.

* * * * *